(12) United States Patent
Kim et al.

(10) Patent No.: US 7,479,445 B2
(45) Date of Patent: Jan. 20, 2009

(54) METHODS OF FORMING FIELD EFFECT TRANSISTORS HAVING T-SHAPED GATE ELECTRODES USING CARBON-BASED ETCHING MASKS

(75) Inventors: Dong-Chan Kim, Seoul (KR); Chang-Jin Kang, Gyeonggi-do (KR); Kyeong-Koo Chi, Seoul (KR); Sung-Hoon Chung, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 228 days.

(21) Appl. No.: 11/247,937

(22) Filed: Oct. 11, 2005

(65) Prior Publication Data

US 2006/0079076 A1    Apr. 13, 2006

(30) Foreign Application Priority Data

Oct. 12, 2004    (KR) ...................... 10-2004-0081501

(51) Int. Cl.
*H01L 21/28*    (2006.01)
*H01L 21/335*    (2006.01)

(52) U.S. Cl. ..................... 438/574; 438/579; 438/589; 438/270; 438/294

(58) Field of Classification Search ................. 438/270, 438/574, 578, 579, 589
See application file for complete search history.

(56) References Cited

U.S. PATENT DOCUMENTS

| | | | |
|---|---|---|---|
| 4,600,563 A * | 7/1986 | Diederich | 422/186.29 |
| 5,869,365 A * | 2/1999 | Sakura | 438/182 |
| 6,063,699 A * | 5/2000 | Hanafi et al. | 438/589 |
| 6,069,091 A | 5/2000 | Chang et al. | |
| 6,291,356 B1 * | 9/2001 | Ionov et al. | 438/710 |
| 6,348,395 B1 * | 2/2002 | Clevenger et al. | 438/424 |
| 6,391,720 B1 | 5/2002 | Sneelal et al. | |
| 6,664,154 B1 * | 12/2003 | Bell et al. | 438/197 |
| 6,696,759 B2 | 2/2004 | Clevenger et al. | |
| 6,864,164 B1 * | 3/2005 | Dakshina-Murthy et al. | 438/585 |
| 6,924,191 B2 * | 8/2005 | Liu et al. | 438/241 |
| 7,132,333 B2 * | 11/2006 | Schloesser et al. | 438/272 |
| 2006/0110884 A1 * | 5/2006 | Wang et al. | 438/270 |

FOREIGN PATENT DOCUMENTS

| | | |
|---|---|---|
| JP | 2000-200828 | 7/2000 |
| KR | 1020040032693 A | 4/2004 |
| KR | 10-2004-0051622 | 6/2004 |

OTHER PUBLICATIONS

Office Action, Korean Application No. 10-2004-0081501, May 18, 2006.

* cited by examiner

*Primary Examiner*—M. Wilczewski
(74) *Attorney, Agent, or Firm*—Myers Bigel Sibley & Sajovec

(57) ABSTRACT

Methods of forming field effect transistors include forming a first electrically insulating layer comprising mostly carbon on a surface of a semiconductor substrate and patterning the first electrically insulating layer to define an opening therein. A trench is formed in the substrate by etching the surface of the substrate using the patterned first electrically insulating layer as an etching mask. The trench is filled with a gate electrode. The first electrically insulating layer is patterned in an ambient containing oxygen. This oxygen-containing ambient supports further oxidation of trench-based isolation regions within the substrate when they are exposed by openings within the first electrically insulating layer.

5 Claims, 17 Drawing Sheets

METHODS OF FORMING FIELD EFFECT TRANSISTORS HAVING T-SHAPED GATE ELECTRODES USING CARBON-BASED ETCHING MASKS

REFERENCE TO PRIORITY APPLICATION

This application claims priority to Korean Patent Application No. 2004-81501, filed Oct. 12, 2004, the disclosure of which is hereby incorporated herein by reference.

FIELD OF THE INVENTION

The present invention relates to integrated circuit fabrication methods and, more particular, to methods of forming field effect transistors in semiconductor substrates.

BACKGROUND OF THE INVENTION

Generally, a transistor is formed using an active region isolated by a device isolation layer in a semiconductor substrate. The transistor may have a planar-type gate pattern on the active region, and source/drain regions in the semiconductor substrate that underlie the planar-type gate pattern. A channel region is disposed in the semiconductor substrate under the planar-type gate pattern. The channel region allows charges in the semiconductor substrate to flow into the source region, or into the drain region.

With a design rule of semiconductor devices scaled down, sizes of the channel region, the planar-type gate pattern and the source/drain regions of the transistor are also reduced. In order to cope with the above scaling-down, there may be introduced, a trench-shaped channel-portion hole in the semiconductor substrate and a gate pattern filling the channel-portion hole instead of the planar-type gate pattern. At this time, the gate pattern filling the channel-portion hole has a channel region in the semiconductor substrate confining the channel-portion hole. The channel region around the gate pattern filling the channel-portion hole has a dimension greater than that under the planar-type gate pattern.

However, the semiconductor device having the channel-portion hole may have a device isolation layer that is disposed at a lower level than an upper surface of the active region of the semiconductor substrate. The channel-portion hole may be formed by performing an etch process in the semiconductor substrate, using self-aligned patterns on the semiconductor substrate as an etch mask. At this time, the etch process may remove a portion of the device isolation layer, thereby deteriorating electrical characteristics of the transistor.

U.S. Pat. No. 6,069,091 to Fa-Yuan Chang, et. al. discloses in-situ sequential silicon containing hard mask layer/ silicon layer plasma etch method. According to the '091 patent, the method includes providing a semiconductor substrate, and sequentially forming a blanket silicon layer and a blanket silicon-containing hard mask layer on the semiconductor substrate. Further, a patterned photoresist layer is formed on the blanket silicon-containing hard mask layer. The blanket silicon-containing hard mask layer is formed of one selected from the group consisting of silicon oxide, silicon nitride, silicon oxynitride and a composite of the above materials. The blanket silicon layer is formed of silicon.

The method includes performing a first plasma etch process on the blanket silicon-containing hard mask layer, using the patterned photoresist layer as an etch mask. The first plasma etch process forms a patterned silicon-containing hard mask layer on the blanket silicon layer. The first plasma etch process may be performed using a bromine-containing etchant source gas along with an etchant source gas containing fluoride and carbon. The method further includes performing a second plasma etch process on the blanket silicon layer, using the patterned photoresist layer and the patterned silicon-containing hard mask layer. The second plasma etch process forms at least a partially etched silicon layer on the semiconductor substrate. At this time, the second plasma etch process may be performed using a chlorine-containing enchant source gas together with an etchant source gas containing fluoride and carbon, and a bromine-containing etchant source gas.

Unfortunately, the method includes generating byproducts of $Si_xF_y$, $Si_xBr_y$, and $Si_xCl_y$ using the etchant source gases of the second plasma etch process at a point of exposing the semiconductor substrate. These by-products are volatile gases and may etch the semiconductor substrate. Further, in the case that the second plasma etch process is performed on the semiconductor substrate having a device isolation layer, the device isolation layer can be removed. As a result, electrical characteristics of a transistor may be deteriorated.

SUMMARY OF THE INVENTION

Embodiments of the present invention include methods of forming field effect transistors having trench-based gate electrodes that are separated from each other by device isolation regions. These methods include the steps of forming a first electrically insulating layer comprising mostly carbon on a surface of a semiconductor substrate and patterning the first electrically insulating layer to define an opening therein. A step is then performed to form a trench in the semiconductor substrate by etching the surface of the semiconductor substrate using the patterned first electrically insulating layer as an etching mask. A gate electrode of the field effect transistor is then formed in the trench.

According to these embodiments, the step of forming a gate electrode is preceded by the step of removing the patterned first electrically insulating layer. The step of patterning the first electrically insulating layer may also be preceded by the steps of forming a second electrically insulating layer on the first electrically insulating layer and patterning the second electrically insulating layer to define an opening therein that exposes the first electrically insulating layer. This step of patterning the second electrically insulating layer includes etching the second electrically insulating layer using a first etchant and the step of patterning the first electrically insulating layer includes etching the first electrically insulating layer using a second etchant different from the first etchant. The step of patterning the first electrically insulating layer also includes etching the first electrically insulating layer using the patterned second electrically insulating layer as an etching mask. This second electrically insulating layer may be formed of a material selected from the group consisting of silicon nitride and silicon oxynitride.

According to further aspects of these embodiments, the step of forming a gate electrode includes depositing a blanket layer of polysilicon on the etched surface of the semiconductor substrate and into the trench. This depositing step is followed by the step of patterning the blanket layer of polysilicon to define a gate electrode having a T-shaped cross-section. The step of patterning the first electrically insulating layer may also include etching the first electrically insulating layer in an ambient containing oxygen. In the event the semiconductor substrate includes electrically insulating device isolation regions therein, then the step of etching the first electrically insulating layer may include etching the first electrically insulating layer to expose the surface of the semiconductor substrate and expose a device isolation region. Here, the step of etching the first electrically insulating layer includes thickening the device isolation region in the ambient containing oxygen.

DETAILED DESCRIPTION OF THE INVENTION

Figure 1:
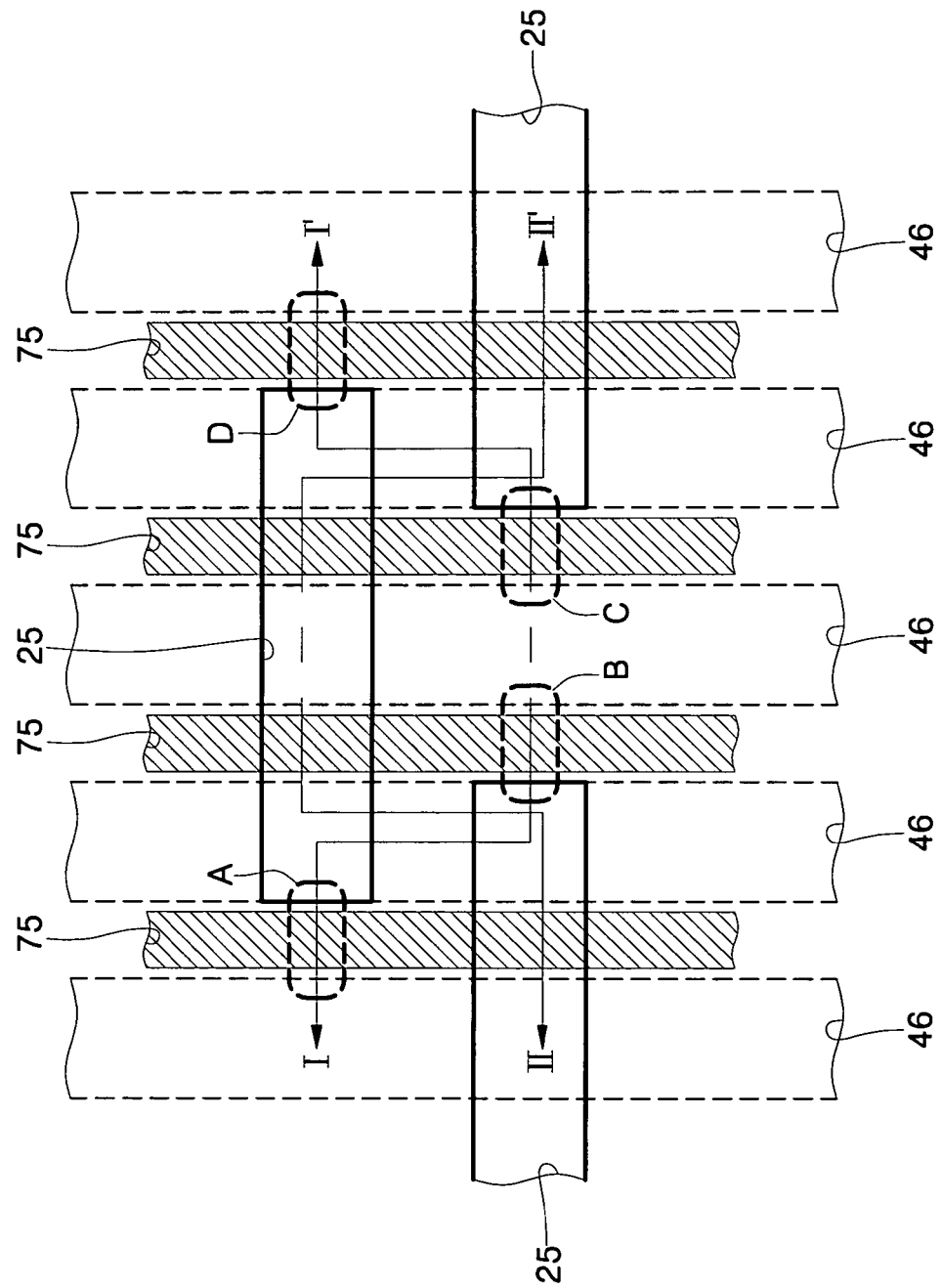
FIG. 1 is a layout view of a semiconductor device according to the invention.

The invention will now be described more fully hereinafter with reference to the accompanying drawings, in which preferred embodiments of the invention are shown. This invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the thicknesses of layers and regions are exaggerated for clarity. Like numbers refer to like elements throughout the specification.

FIG. 1 is a layout view of a semiconductor device according to the invention, and FIGS. 2, 4, 6, 8, 10, 12, 14 and 16 are cross-sectional views illustrating a method of fabricating a semiconductor device taken along line I-I' of FIG. 1, respectively. Further, FIGS. 3, 5, 7, 9, 11, 13, 15 and 17 are sectional views illustrating a method of fabricating a semiconductor device taken along line II-II' of FIG. 1, respectively.

Figure 2:
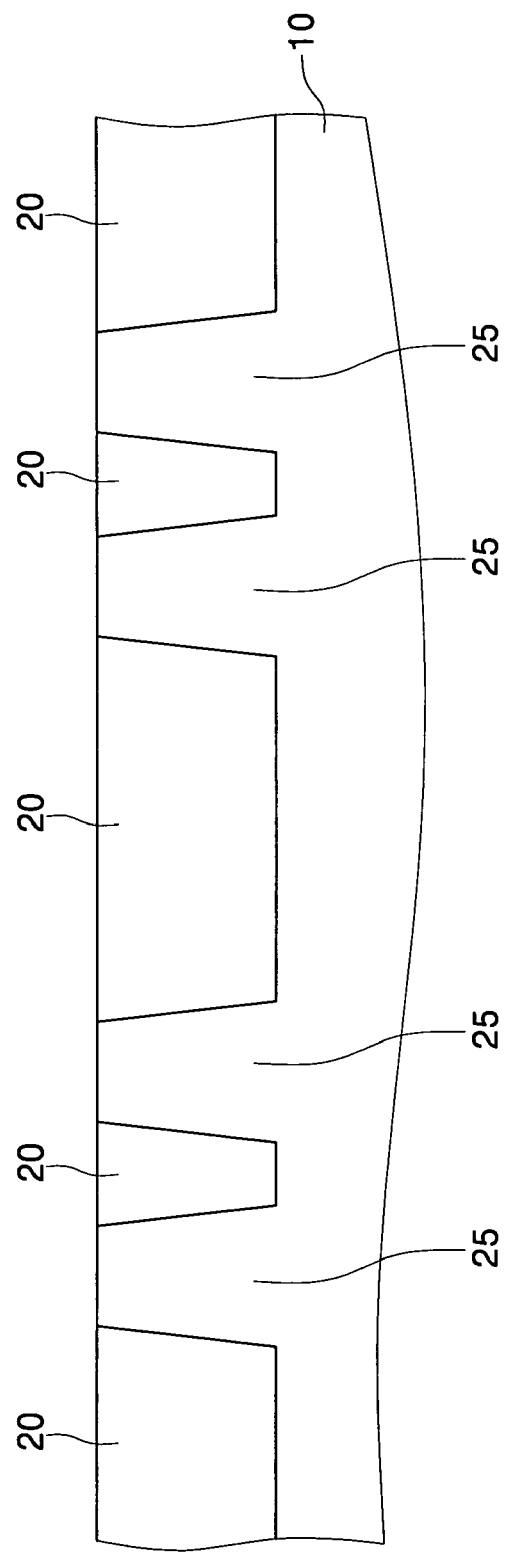
FIGS. 2, 4, 6, 8, 10, 12, 14 and 16 are cross-sectional views illustrating a method of fabricating a semiconductor device taken along line I-I' of FIG. 1, respectively.
Figure 3:
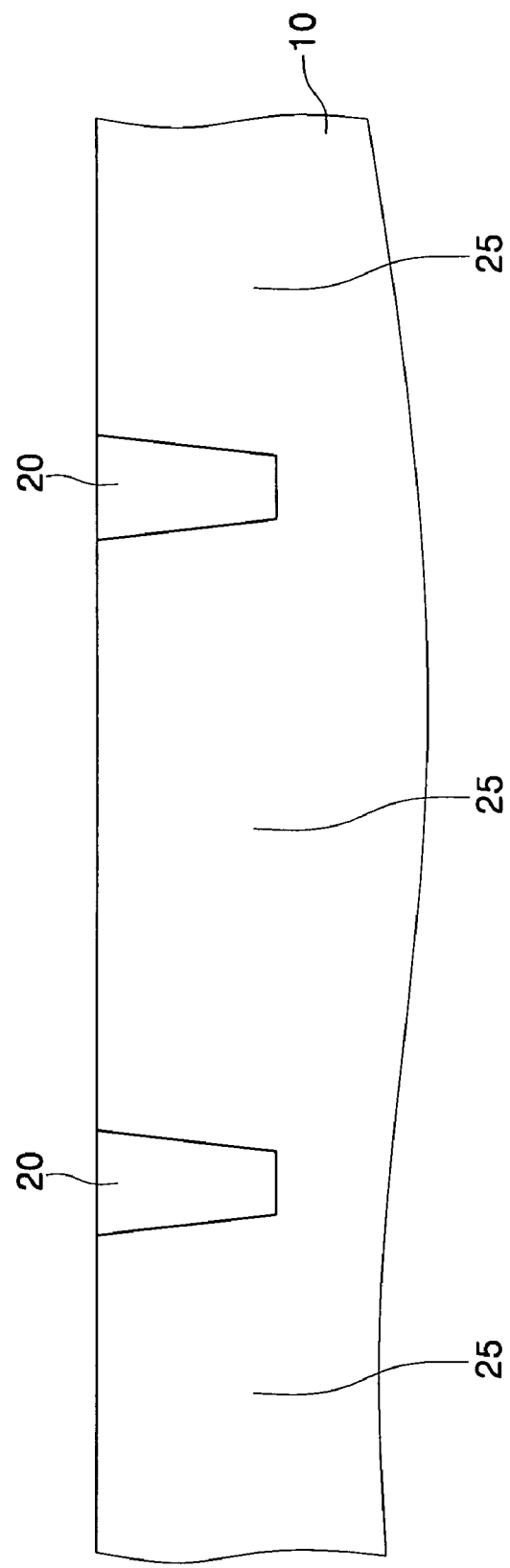
FIGS. 3, 5, 7, 9, 11, 13, 15 and 17 are sectional views illustrating a method of fabricating a semiconductor device taken along line II-II' of FIG. 1, respectively.
Figure 4:
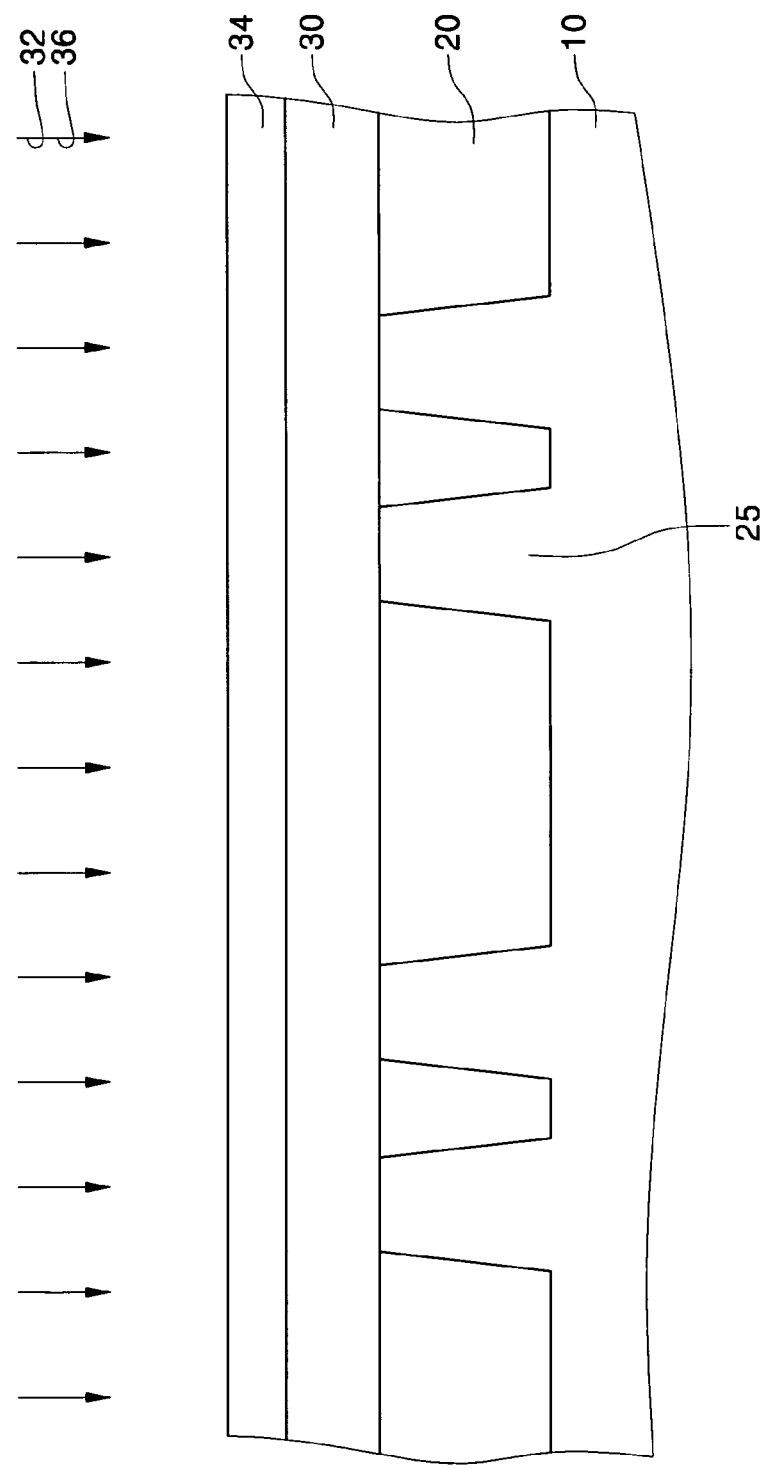
Figure 5:
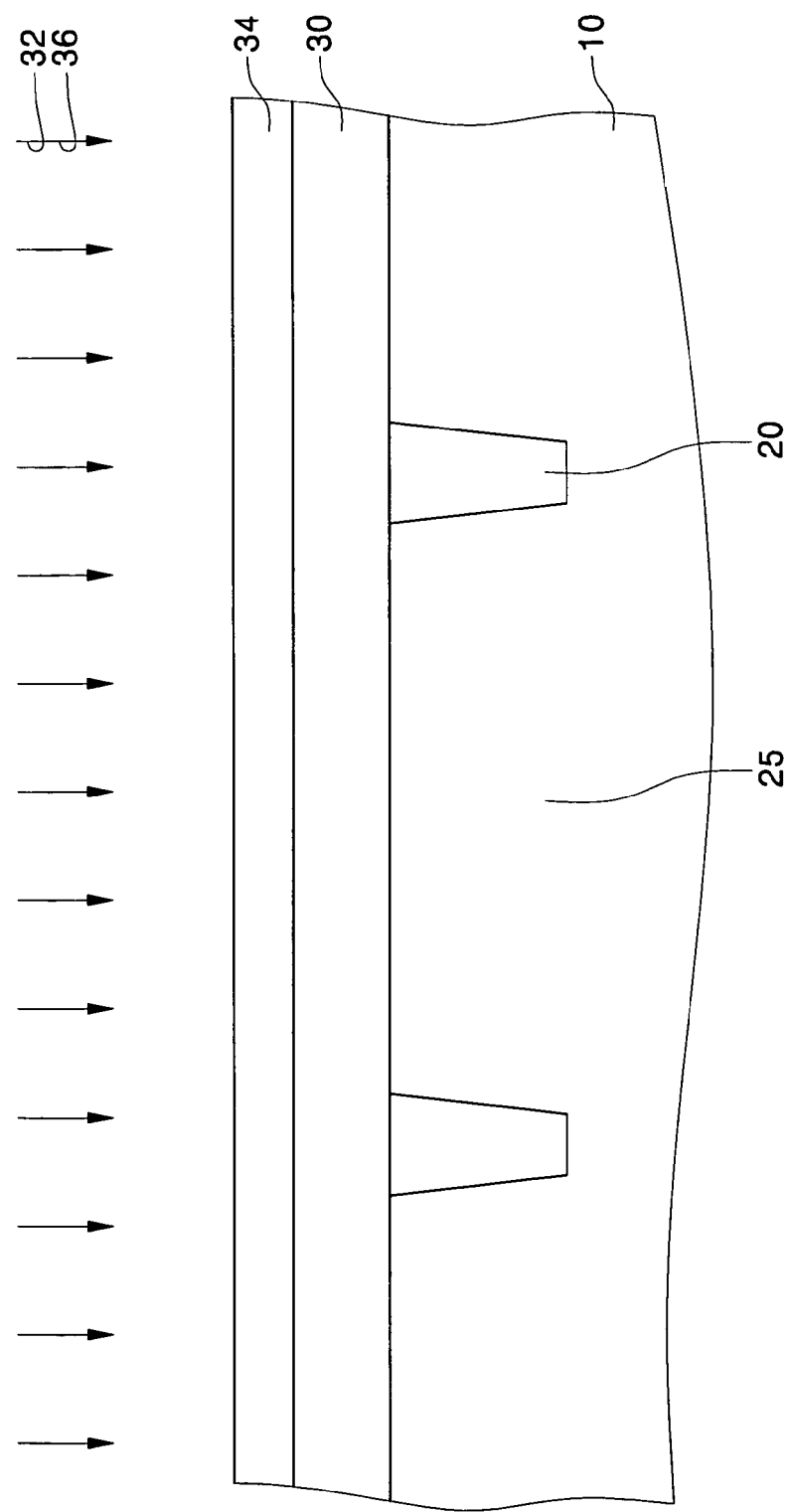
Figure 6:
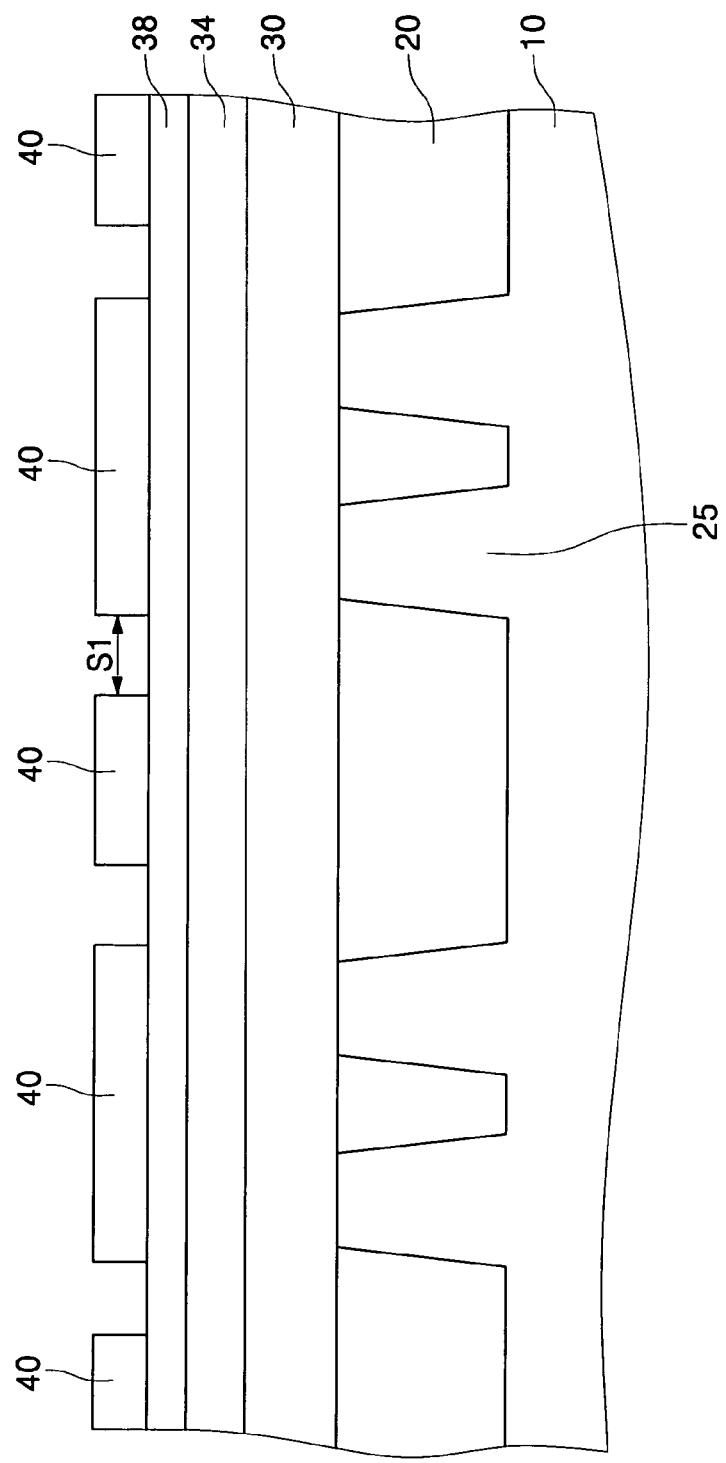
Figure 7:
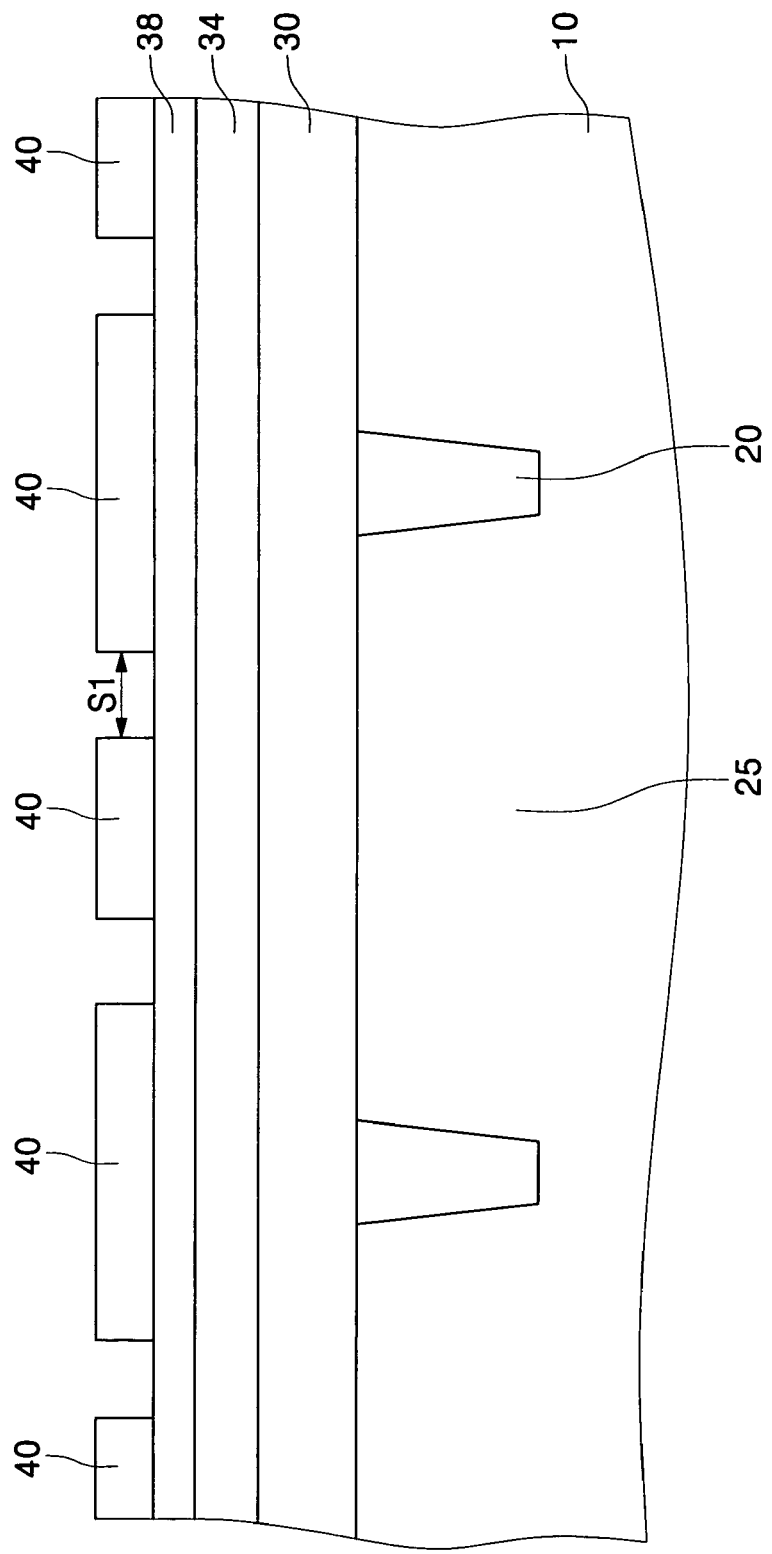

Referring to FIGS. 1 to 3, a device isolation layer 20 is formed in a semiconductor substrate 10 to isolate active regions 25 from each other. The active regions 25 may be formed spaced from each other through the device isolation layer 20 in the longitudinal direction thereof and in a direction orthogonal to the longitudinal direction. The device isolation layer 20 is preferably formed by sequentially stacking a silicon nitride layer ($Si_3N_4$) and a silicon oxide layer ($SiO_2$) at least one time. The silicon oxide layer may be formed using a chemical vapor deposition (CVD) process or a high density plasma (HDP) process. The silicon nitride layer may be formed using a CVD process or a plasma enhanced CVD (PECVD) process.

Referring to FIGS. 1 and 4 to 7, a carbon layer 30 is formed to cover the semiconductor substrate having the device isolation layer 20 and the active region 25 therein. The carbon layer 30 is preferably formed of a layer containing carbon of 90% or higher. The carbon layer 30 may be preferably formed using a CVD process 32. The carbon layer 30 also may be formed using a spin coating process like spin-on glass. Then, a silicon-containing insulating layer 34 is formed on the carbon layer 30. The silicon-containing insulating layer 34 may be formed using silicon nitride($Si_3N_4$) or silicon oxynitride (SiON). The silicon-containing insulating layer 34 may be preferably formed using a CVD process 36. The silicon-containing insulating layer 34 also may be formed using a PECVD process.

An anti-reflection coating (ARC) 38 may be formed on the silicon-containing insulating layer 34. The ARC layer 38 may be formed using organic materials or inorganic materials. Photoresist patterns 40 are formed on the ARC 38. The photoresist patterns 40 may be preferably formed as a line shape to run across the active regions 25. The photoresist patterns 40 are preferably formed spaced from each other with a predetermined distance S1. The ARC 38 need not be formed on the silicon-containing insulating layer 34 in the event the photoresist patterns 40 can be formed with a desired size by a photolithography process.

Figure 8:
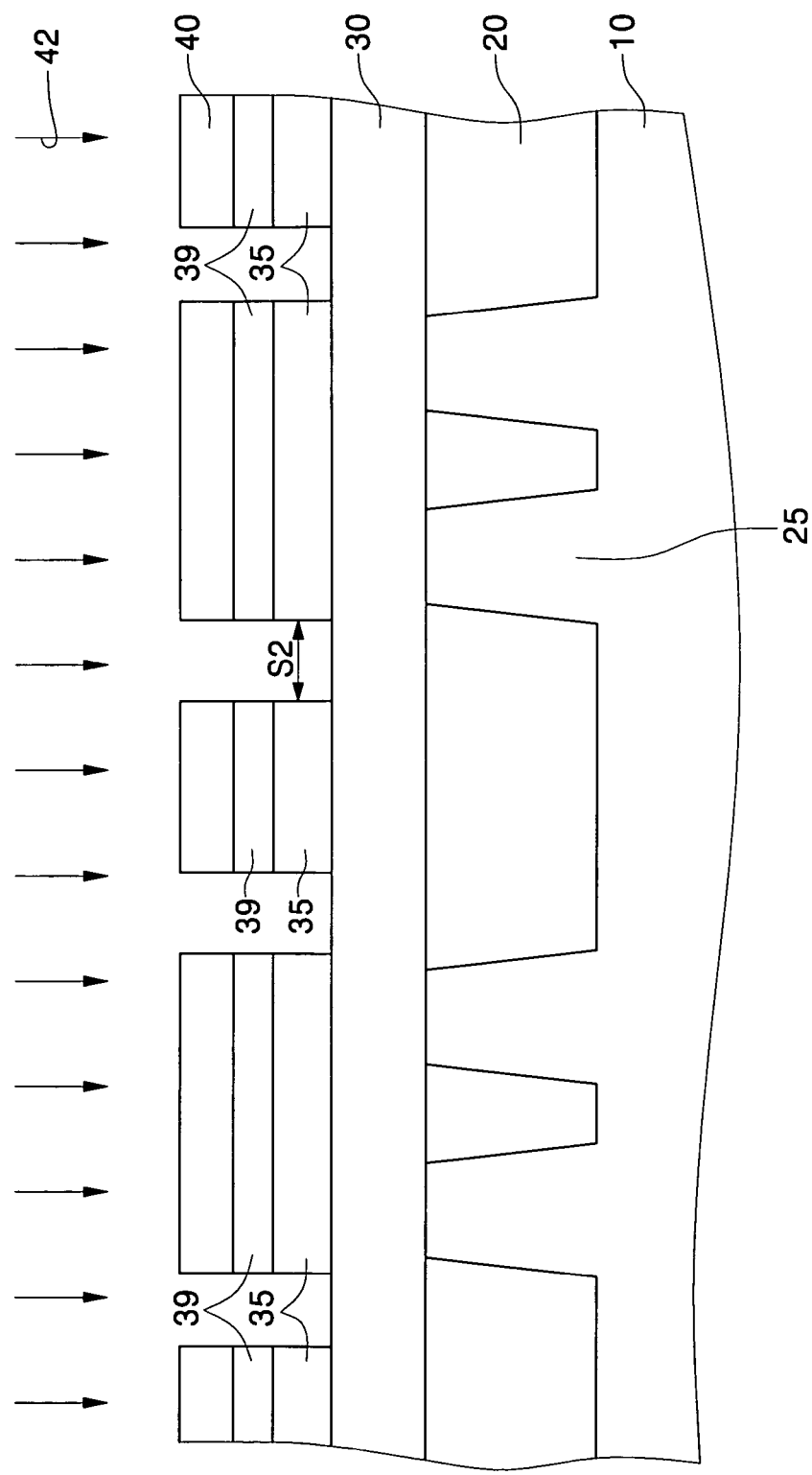
Figure 9:
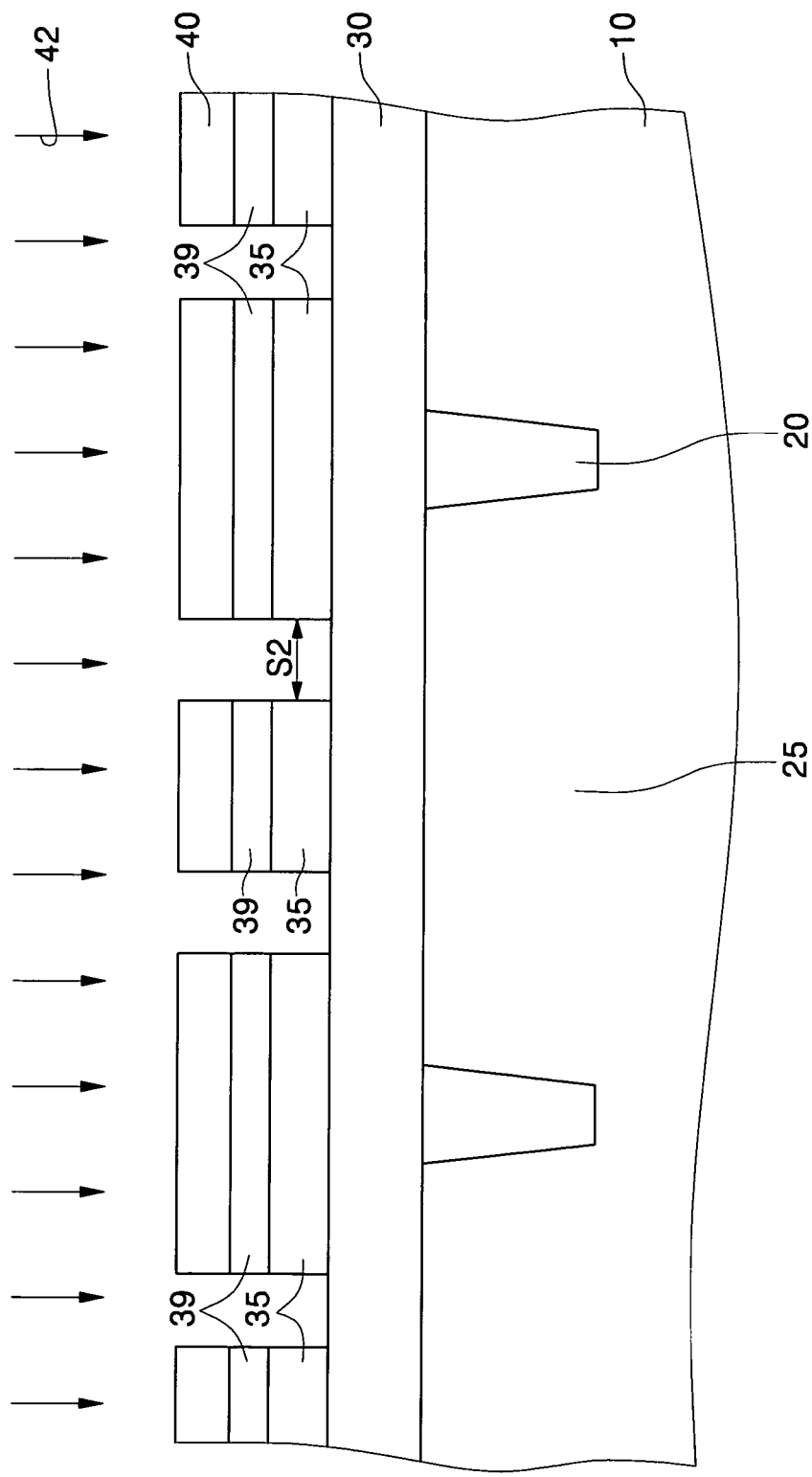

Referring to FIGS. 1, 8, and 9, an etch process 42 is sequentially performed on the ARC layer 38 and the silicon-containing insulating layer 34, using the photoresist patterns 40 as an etch mask. The etch process 42 sequentially forms insulating layer patterns 35 and ARC layer patterns 39 on the carbon layer 30. The etch process 42 is preferably performed using an etch process gas including carbon, hydrogen, fluorine and argon. In particular, the etch process 42 may be performed using an etch process gas including carbon, fluorine and argon. At this time, by the performance of the etch process 42, polymer residues, including carbon and fluorine, are formed on sidewalls of the insulating layer patterns 35 and the ARC layer patterns 39 respectively. Preferably, the insulating layer patterns 35 and the ARC layer patterns 39 are respectively formed spaced from each other with a predetermined distance S2. The distance S2 between the insulating layer patterns 35 and between the ARC layer patterns 39 is preferably formed smaller than the distance S1 between the photoresist patterns 40 of FIG. 7. However, in some embodiments, the distance S2 between the insulating layer patterns 35 and between the ARC layer patterns 39 may be formed the same as the distance S1 between the photoresist patterns 40 of FIG. 7.

Figure 10:
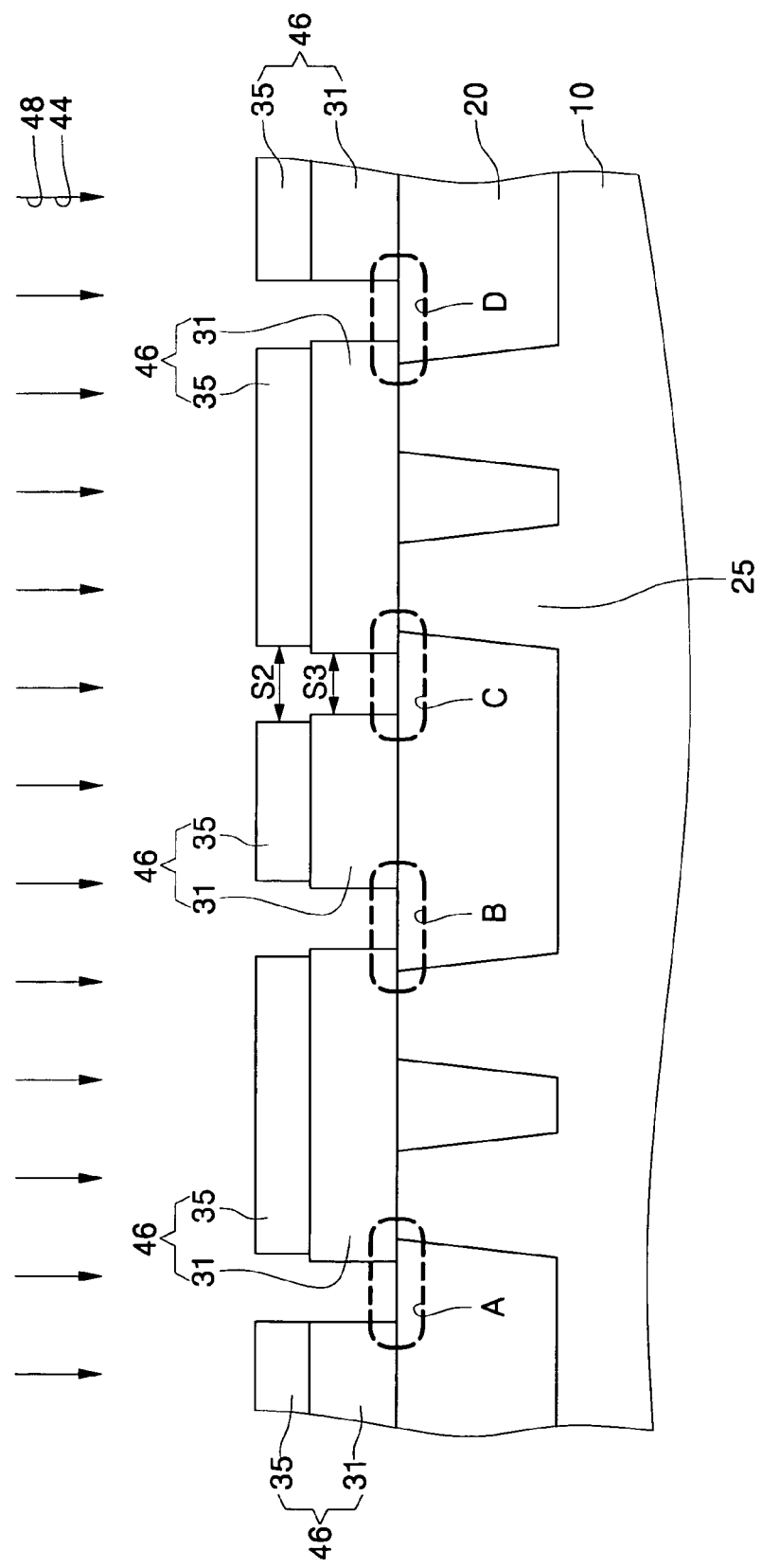
Figure 11:
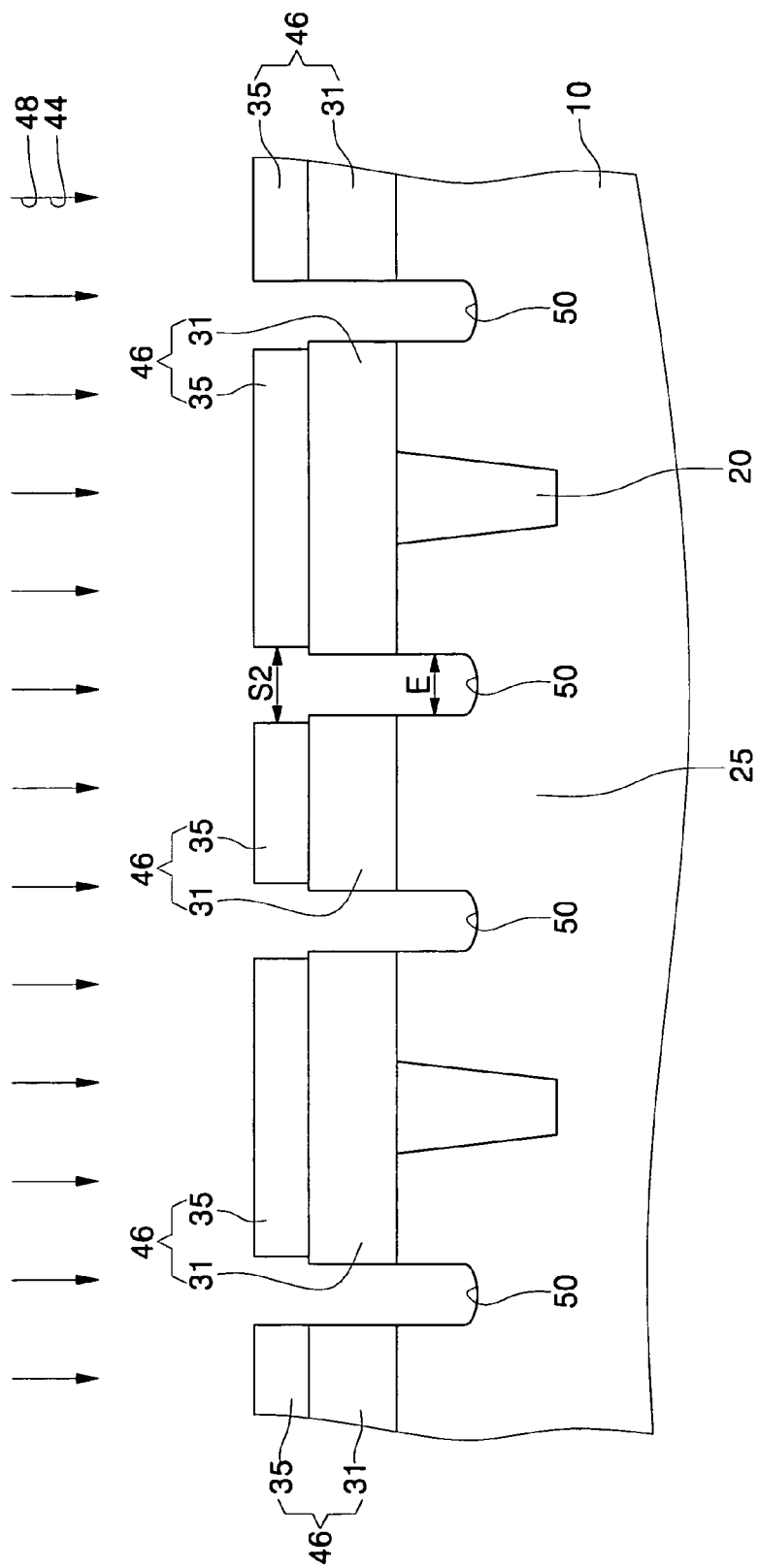

Referring to FIGS. 1, 10 and 11, an etch process 44 is performed on the carbon layer 30, using the photoresist patterns 40, the ARC layer patterns 39 and the insulating layer patterns 35 as an etch mask. The etch process 44 forms carbon layer patterns 31 between the insulating layer patterns 35 and the semiconductor substrate 10. The etch process 44 is preferably performed in-situ using the same chamber as used in the etch process 42 in FIGS. 8 and 9. The etch process 44 may be preferably performed using an etch process gas including hydrogen and nitrogen, hydrogen and bromine or only nitrogen based on carbon, oxygen and argon. In the event an etch process gas including hydrogen and nitrogen, or only nitrogen based on carbon, oxygen and argon is used, the etch process 44 may form polymers including carbon and nitrogen respectively on the sidewalls of the carbon layer patterns 31. In the event an etch process gas including hydrogen and bromine based on carbon, oxygen and argon is used, the etch process 44 may form polymers including carbon, hydrogen and bromine respectively on the sidewalls of the carbon layer patterns 31. As such, the carbon layer patterns 31 are preferably formed spaced from each other with a predetermined distance S3. The distance S3 between the carbon layer patterns 31 is typically smaller than the distance S2 between the insulating layer patterns 35. Alternatively, the distance S3 between the carbon layer patterns 31 may be the same as the distance S2 between the insulating layer patterns 35.

The etch process 44 is performed to expose the active regions 25 and the device isolation layer 20 between the carbon layer patterns 31. The etch process 44 also is performed to remove the ARC layer patterns 39 and the photoresist patterns 40 on the insulating layer patterns 35. Moreover, after the device isolation layer 20 is exposed by the etch process 44, the oxygen of the etch process gas may react with the silicon oxide layer, thereby forming another silicon oxide layer on the device isolation layer 20. Concurrently, after the semiconductor substrate 10 is exposed by the etch process 44, the oxygen of the etch process gas may react with the single crystal silicon, thereby forming another silicon oxide layer on the semiconductor substrate 10. Thus, by the performance of the etch process 44, the upper surface of the device isolation layer 20 in A through D regions of FIG. 1 is formed higher than the upper surface of the active regions 25.

Each of the carbon layer patterns 31 and each of the insulating layer patterns 35 are sequentially stacked on the semiconductor substrate having the device isolation layer 20, thereby forming one of self-aligned patterns 46. Three of the self-aligned patterns 46 can be sequentially arranged from the device isolation layer 20 of FIG. 1 through the A region to a center portion of the semiconductor substrate 10 of the active region 25. At this time, one of the three self-aligned patterns 46 is preferably at least formed at a boundary of the active region 25 between the remaining self-aligned patterns 46. The remaining self-aligned patterns 46 are preferably formed on the active region 25 and the device isolation layer 20, respectively. The remaining self-aligned patterns 46 are preferably formed to expose the upper surfaces of the device isolation layer 20 adjacent to the active region 25.

Next, an etch process 48 is continuously performed on the semiconductor substrate 10, using the self-aligned patterns 46 as an etch mask. The etch process 48 forms channel-portion holes 50, which are formed from the upper surface of the active regions 25 downward with a predetermined depth. A diameter E of the channel-portion hole 50 is preferably formed smaller than the distance S3 between the carbon layer patterns 31. Alternatively, the diameter E of the channel-portion hole 50 may be formed equal to the distance S3 between the carbon layer patterns 31. The etch process 48 is preferably performed to provide an etching selectivity ratio less than "1" with respect to the device isolation layer 20. Thus, the etch process 48 removes the another silicon oxide layer on the device isolation layer 20 and the active regions 25, and concurrently, partially etches the semiconductor substrate 10. By the performance of the etch process 48, the device isolation layer 20 is formed such that its upper surface is at the same level in height as the upper surface of the active region 25. Thus, a physical attack by the etch process 48 applied between the device isolation layer 20 and the active region 25 can be inhibited.

The etch process 48 may use an etch process gas including hydrogen, chlorine, bromine and argon. At this time, the etch process 48 forms a polymer containing hydrogen, silicon and bromine respectively on sidewalls of the semiconductor substrate 10 confining the channel-portion holes 50. Further, the etch process 48 may be performed using an etch process gas including nitrogen and fluorine, or only nitrogen based on chlorine and argon. In the event of using the etch process gas including nitrogen and fluorine or only nitrogen based on chlorine and argon, the etch process 48 forms polymer residues containing hydrogen, silicon, bromine and nitrogen respectively on the sidewalls of the semiconductor substrate 10 confining the channel-portion holes 50. After the performance of the etch process 48, it is preferable to remove the self-aligned patterns 46 and polymer residues from the semiconductor substrate 10.

Figure 12:
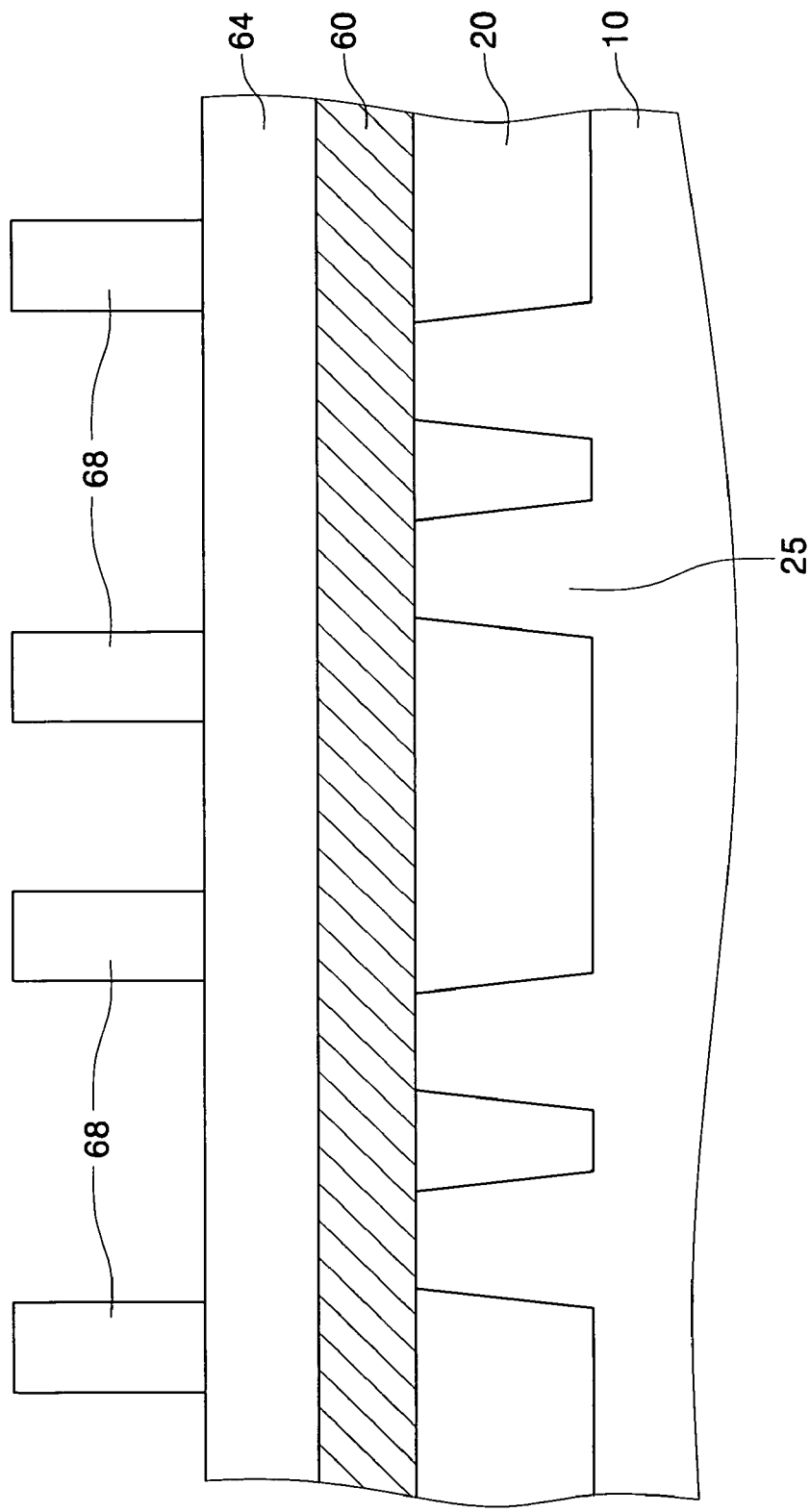
Figure 13:
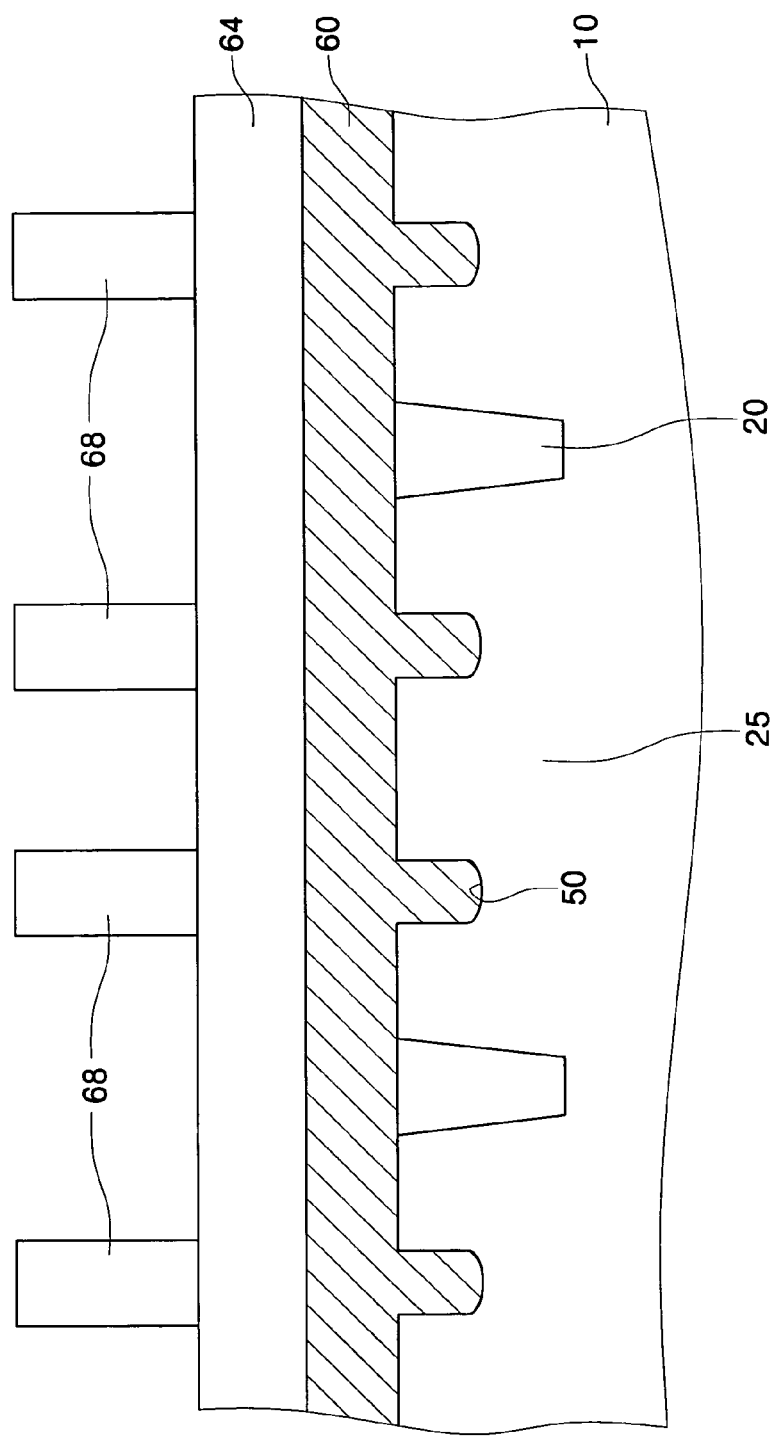
Figure 14:
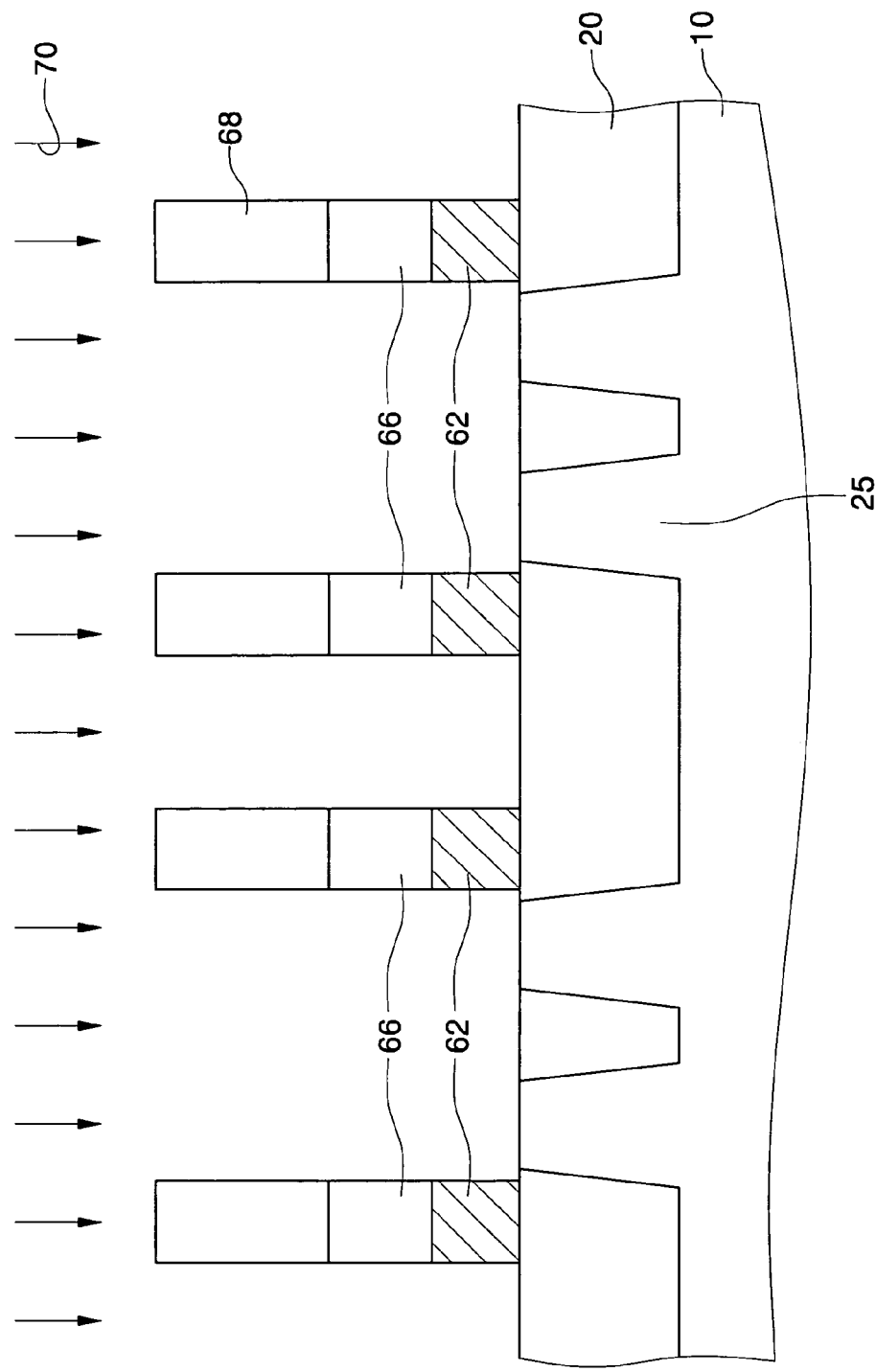
Figure 15:
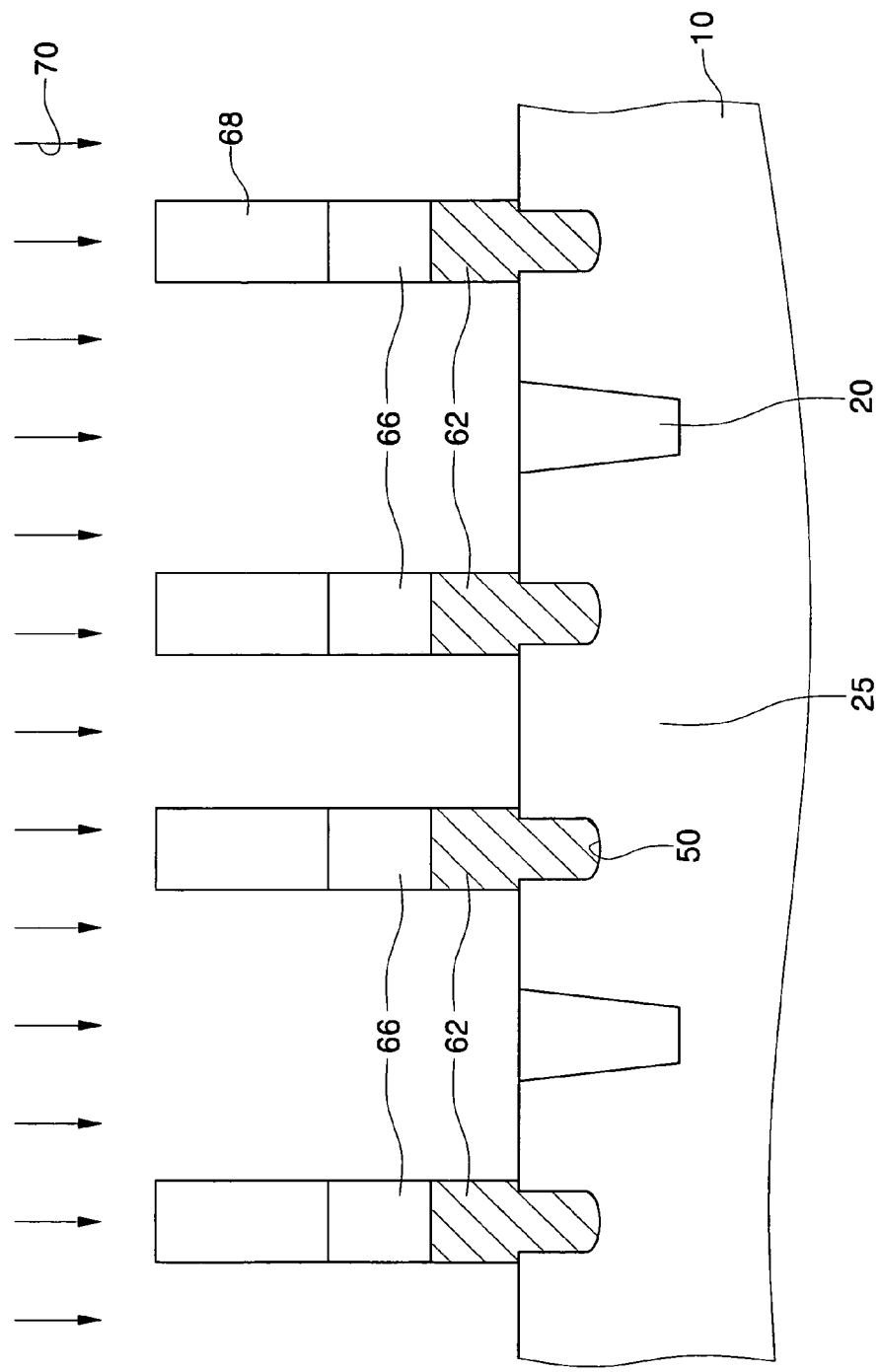
Figure 16:
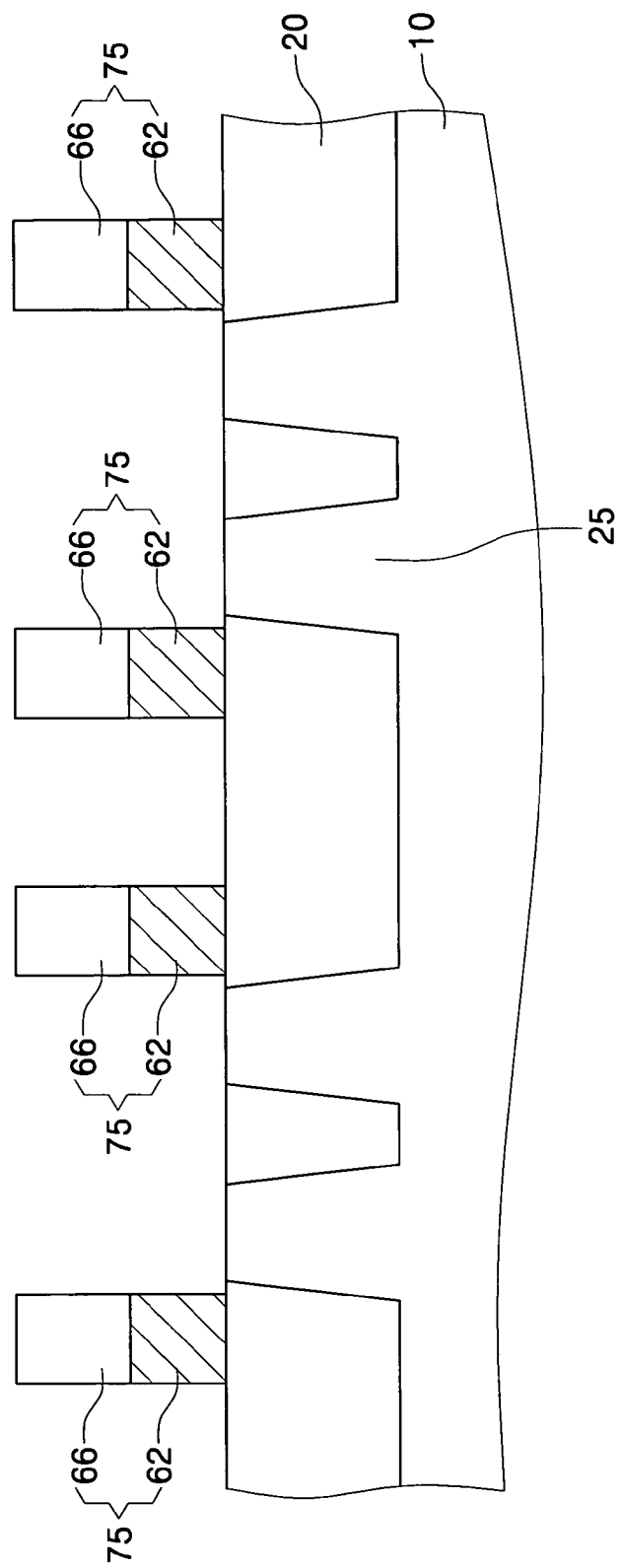
Figure 17:
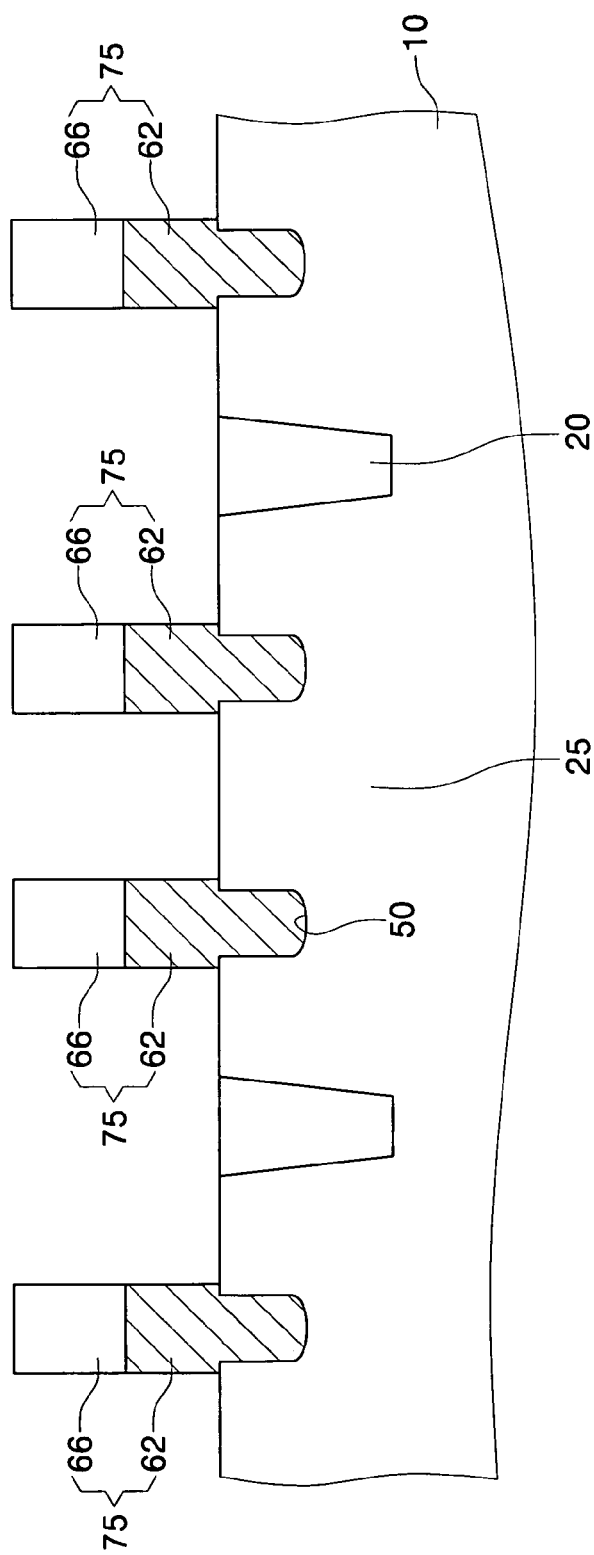

Referring to FIGS. 1, 12 and 13, a gate layer 60 and a gate capping layer 64 are sequentially formed on the semiconductor substrate 10 having the channel-portion holes 50. The gate layer 60 is preferably formed on the semiconductor substrate 10 to fully fill the channel-portion holes 50. Photoresist patterns 68 are then formed on the gate capping layer 64. The photoresist patterns 68 are preferably formed with a line shape between the self-aligned patterns 46 of FIG. 1 and aligned to the channel-portion holes 50. The gate capping layer 64 is preferably formed using a silicon nitride layer ($Si_3N_4$). The gate capping layer 64 may be formed using a silicon oxide layer. The gate layer 60 is preferably formed using an $N^+$-type polysilicon layer and a metal silicide layer, which are sequentially stacked. Alternatively, the gate layer 60 may be formed using only an $N^+$-type polysilicon layer.

Referring to FIGS. 1, and 14 to 17, an etch process 70 is sequentially performed on the gate capping layer 64 and the gate layer 60, using the photoresist patterns 68 as an etch mask. The etch process 70 forms gate capping layer patterns 66 and gate layer patterns 62 between the photoresist patterns 68 and the semiconductor substrate 10. The etch process 70 is preferably performed to provide an etching selectivity ratio less than "1" with respect to the device isolation layer 20. After the performance of the etch process 70, the photoresist patterns 68 are removed from the semiconductor substrate 10.

The gate layer patterns 62 and the gate capping layer patterns 66 are sequentially stacked on the semiconductor substrate 10, thereby forming gate patterns 75 respectively. The gate patterns 75 are formed to fill the channel-portion holes 50, respectively, and to run across the active regions 25 as shown in FIG. 1. Since the upper surface of the device isolation layer 20 is formed at the same level in height as the active region 25, the etch process 70 does not leave residue of the gate layer 60 between the device isolation layer 20 and the active region 25, and the gate patterns 75 can be formed precisely. As such, the device isolation layer 20 prevents the gate patterns 75 and the active regions 25 in the A through D regions from being electrically connected or physically contacted with each other.

As described above, the invention provides a way of locating the device isolation layer and the active regions at least at the same level in height after the formation of the channel-portion holes by using the self-aligned patterns including a carbon layer. Therefore, the semiconductor device having the channel-portion holes can have excellent electrical characteristics of a transistor.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A method of forming a field effect transistor, comprising the steps of:
    forming a first electrically insulating layer comprising mostly carbon on a surface of a semiconductor substrate having an electrically insulating device isolation region therein;
    patterning the first electrically insulating layer to define an opening therein by etching the first electrically insulating layer in an ambient containing oxygen to thereby expose the surface of the semiconductor substrate and expose the device isolation region;
    forming a trench in the semiconductor substrate by etching the surface of the semiconductor substrate using the patterned first electrically insulating layer as an etching mask; and
    forming a gate electrode of the field effect transistor in the trench;
    wherein said step of etching the first electrically insulating layer comprises thickening the device isolation region in the ambient containing oxygen.

2. The method of claim 1, wherein the device isolation region comprises silicon oxide.

3. A method of forming a field effect transistor, comprising the steps of:

forming a first electrically insulating layer on a surface of a semiconductor substrate having a device isolation region therein;

patterning the first electrically insulating layer to define an opening therein that exposes a surface of a semiconductor active region within the substrate and the device isolation region, by selectively etching the first electrically insulating layer in an ambient containing oxygen;

forming a trench in the semiconductor substrate by etching the surface of the semiconductor substrate using the patterned first electrically insulating layer as an etching mask; and forming a gate electrode of the field effect transistor in the trench;

wherein selectively etching the first electrically insulating layer comprises thickening the device isolation region in the ambient containing oxygen.

4. The method of claim 3, wherein the first electrically insulating layer comprises mostly carbon.

5. The method of claim 4, wherein a percentage of carbon in the first electrically insulating layer exceeds about 90 percent.

* * * * *